(12) United States Patent
Abgaryan et al.

(10) Patent No.: US 8,084,930 B2
(45) Date of Patent: Dec. 27, 2011

(54) MULTIPLE DEVICE SHAPING UNIFORM DISTRIBUTION OF CURRENT DENSITY IN ELECTRO-STATIC FOCUSING SYSTEMS

(75) Inventors: Artush A. Abgaryan, Huntington, NY (US); Eli Levi, Dix Hills, NY (US)

(73) Assignee: ATTI International Services Company, Inc., Hauppauge, NY (US)

( * ) Notice: Subject to any disclaimer, the term of this patent is extended or adjusted under 35 U.S.C. 154(b) by 0 days.

(21) Appl. No.: 12/957,576

(22) Filed: Dec. 1, 2010

(65) Prior Publication Data

US 2011/0068675 A1    Mar. 24, 2011

Related U.S. Application Data

(63) Continuation of application No. 12/769,393, filed on Apr. 28, 2010.

(60) Provisional application No. 61/173,796, filed on Apr. 29, 2009, provisional application No. 61/241,108, filed on Sep. 10, 2009.

(51) Int. Cl.
  *H01J 29/46* (2006.01)
(52) U.S. Cl. ........................................ 313/452; 313/307
(58) Field of Classification Search .......... 313/441–452, 313/307
See application file for complete search history.

(56) References Cited

U.S. PATENT DOCUMENTS

| | | | |
|---|---|---|---|
| 3,517,240 A | 6/1970 | Dickinson | |
| 4,430,570 A | 2/1984 | Takigawa et al. | |
| 4,535,266 A | 8/1985 | Say | |
| 4,542,318 A | 9/1985 | Say | |
| 4,656,391 A | 4/1987 | Say | |
| 4,900,982 A * | 2/1990 | Kolpin | 313/452 |
| 5,034,654 A * | 7/1991 | Leyland et al. | 313/449 |
| 5,125,019 A | 6/1992 | Evain et al. | |
| 5,589,736 A | 12/1996 | Lien et al. | |
| 5,659,225 A | 8/1997 | Tsuruoka et al. | |
| 5,763,993 A | 6/1998 | Park et al. | |
| 5,877,594 A | 3/1999 | Miyano et al. | |
| 5,965,977 A | 10/1999 | Makishima | |
| 6,051,917 A * | 4/2000 | Nakasuji | 313/308 |

(Continued)

FOREIGN PATENT DOCUMENTS

RU    1806417 A3    3/1993

OTHER PUBLICATIONS

International Search Report and Written Opinion for International Application No. PCT/US2010/032988 dated Nov. 30, 2010.

*Primary Examiner* — Toan Ton
*Assistant Examiner* — Andrew Coughlin
(74) *Attorney, Agent, or Firm* — Brian Roffe

(57) ABSTRACT

System that focuses electron beams in an electro-static area to a laminar flow of electrons with uniform distribution of current density and extraordinary demagnification includes a housing having a first interior portion and a second interior portion electrically insulated from the first interior portion. The second interior portion has an electric field-free space. An electrode system is disposed in the first interior portion and includes a cathode assembly and at least one anode assembly. The cathode assembly generates an electron beam that passes through each anode assembly and then into the electric field-free space in the second interior portion. The system parameters may be calculated and created due to the CGMR conceptual method.

17 Claims, 6 Drawing Sheets

U.S. PATENT DOCUMENTS

| | | |
|---|---|---|
| 6,424,104 B1 | 7/2002 | Bae et al. |
| 6,480,572 B2 | 11/2002 | Harris et al. |
| 6,680,564 B2 | 1/2004 | Tomii |
| 7,208,867 B2 | 4/2007 | Kuo et al. |
| 7,323,813 B2 | 1/2008 | Watanabe et al. |
| 7,569,986 B2 | 8/2009 | Chi et al. |
| 7,668,296 B2 | 2/2010 | Schaefer et al. |
| 2003/0010934 A1* | 1/2003 | Katsap et al. ............. 250/492.1 |
| 2003/0218413 A1* | 11/2003 | Chiba ........................ 313/337 |
| 2004/0135515 A1 | 7/2004 | Hamashima et al. |
| 2005/0274911 A1 | 12/2005 | Aloni et al. |
| 2007/0069150 A1 | 3/2007 | Frosien et al. |

* cited by examiner

MULTIPLE DEVICE SHAPING UNIFORM DISTRIBUTION OF CURRENT DENSITY IN ELECTRO-STATIC FOCUSING SYSTEMS

CROSS-REFERENCE TO RELATED APPLICATIONS

This application is a continuation of U.S. patent application Ser. No. 12/769,393 filed Apr. 28, 2010, which claims priority under 35 U.S.C. §119(e) of U.S. provisional patent application Ser. Nos. 61/173,796 filed Apr. 29, 2009 and 61/241,108 filed Sep. 10, 2009, now expired, all of which are incorporated by reference herein.

FIELD OF THE INVENTION

The present invention relates to methods and apparatus for focusing electron beams in an electrostatic area to a laminar flow with a uniform distribution of current density and/or a uniform and extraordinary demagnification of up to 50 times or more for any electro-optic or electro-optical system (EOS).

BACKGROUND OF THE INVENTION

There exist electrostatic focusing systems in electro-vacuum devices that have different applications which require electron beam transmission and transformation. These systems are commonly known as cathode ray tube (CRT), EOS, E-beam and E-gun systems which focus electron beams with a Gaussian distribution of current density in its systems, and are applied in numerous devices, including but not limited to:
Electron gun systems;
CRT microscopes and scanning electron microscopes (SEM);
E-beam lithographic equipment;
E-beam tubes for transmission and transformation;
Electro-optical telescopes and Electro-optical mirror systems;
High speed photonic technology equipment;
Electrostatic focusing systems for linear E-beam acceleration and X-ray tubes;
Electron projector systems, projection CRTs and entertainment CRTs;
Electro-optical converters (EOC) and PCRT—photonic cathode ray tube;
CRT replacement systems;
CRT monitors, TV monitors, graphic, diagnostic and data displays, and industrial, medical, color, monochrome, P.O. and sale monitors.
Military Displays, heads down and heads up displays and targeting displays.
Air traffic control CRTs, Defense CRTs, Flying Spot CRTs, High Resolution CRTs, Laminated CRTs, Radar CRTs, Sonar CRTs, and Surveillance CRTs.
Research and development CRT's, research and marine systems, and E-gun systems in Plasma scientific equipment.
High-performance EOS for testing Infrared (IR) Sensors;
EOS for electronic cotton wear treatment;
EOS for precious stones ennoblement;
EOS for welding and melting equipment.
Computerized Axial Tomography In the above listed items, an integral feature of the current density function is that it has a Gaussian distribution, which inherently loses about 60% of the signal source. This is a fundamental problem that persists, even for conventional cathode technologies whose source is defined by uniform emission. This problem further extends to the area of CRT video systems where residual raster lines (shown in FIG. 7B) are present due to the Gaussian distribution. This results in the loss of source information in every pixel. By contrast, an ideal situation is shown in FIG. 7A where a uniform distribution results in every pixel having a rectangular form of residual rasters where 100% of the source information is maintained.

Conventional techniques generally require a very small focal spot size. This is possible in actual systems only at approximately 4 or 6 times demagnification. In the areas where a focal spot size in the range of nanometers is required, such as Electron beam lithography, multi-cascaded systems will result in a small current of 0.25 nA due to multiple stages of filtering. In SEM, e-beam lithography, electro-optical telescopes and high speed photonic technology equipment, an optical demagnification of about 50 to 1000 times is required. However, a higher current (typically in the range of mA) is necessary to reduce the job time in the exposure area. Generally, an electrostatic focusing system is the part of the electro optic device responsible for the transformation of the electron beam emitted from the source. Electrostatic focusing systems are designed to obtain a Gaussian distribution of current density in an electrostatic focusing area in the system. This achievement is applicable to nearly all electro-optic devices.

SUMMARY OF THE INVENTION

The present invention relates to methods and apparatus for transforming electron beams, and more particularly to methods and apparatus for transforming electron beams to a laminar flow with a uniform, or at least substantially uniform, distribution of current density in the electrostatic area of the EOS. Additionally, some embodiments of the invention enables a uniform or extraordinary demagnification of the focal spot size of up to about 50 times or more using currently existing cathodes. The invention generally does not require any special instrumentation and in some embodiments, is designed to achieve a substantially uniform distribution of current density in the electrostatic focusing area resulting in a potential zero power loss in the transportation of electron emissions from cathode to anode, screen, or any target.

BRIEF DESCRIPTION OF THE DRAWINGS

The following drawings are illustrative of embodiments of the invention and are not meant to limit the scope of the invention as encompassed by the claims.

DETAILED DESCRIPTION OF THE INVENTION

Figure 1:
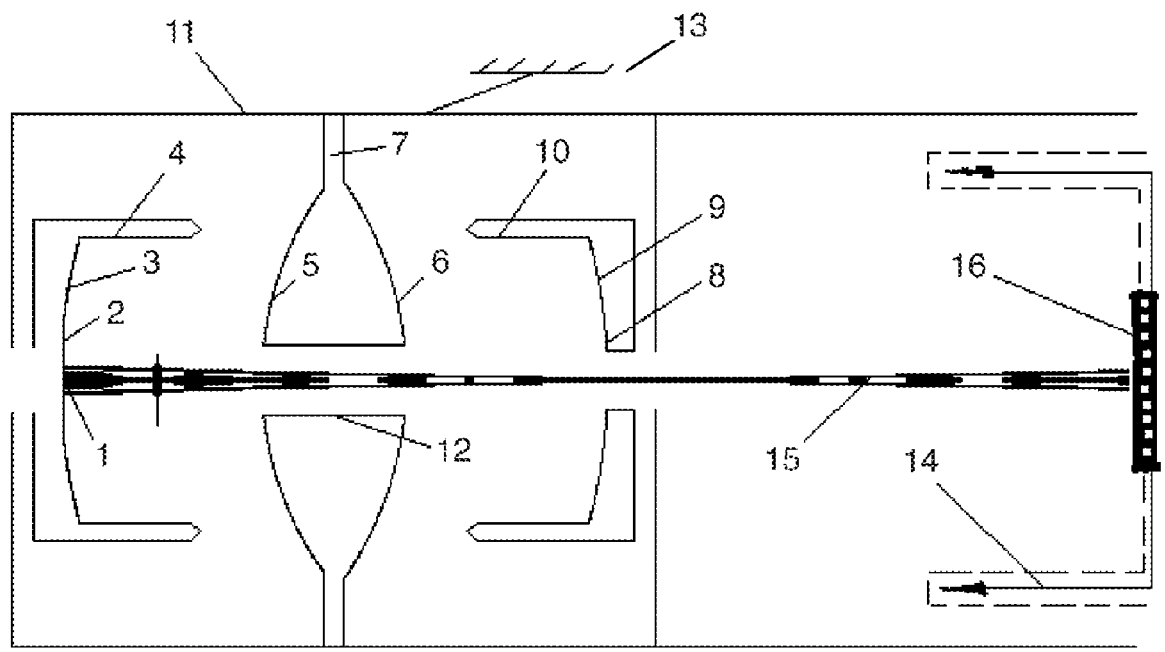
FIG. 1 illustrates an embodiment of a system with an adjustable screen system in accordance with the invention.

Referring to the accompanying drawings wherein like reference numerals refer to the same or similar elements, FIG. 1 shows a preferred embodiment of an EOS in accordance with the invention with a minimum of three electrode systems and an adjustable screen system that forms a laminar flow of electrons with uniform distribution of current density in the electrostatic section and continues in an electric field-free space to the adjustable screen, or as an alternative, any electron beam direct measuring device.

The electrostatic section in the EOS generally includes a field-forming near-cathode electrode system, a focusing electrode system, and an anode electrode system, each of which is discussed in detail below. The electrostatic section may also possibly include an additional anode or a plurality of anodes designed for correction of aberrations in the crossover.

The field-forming near-cathode electrode system and the focusing electrode system together are considered a source for the formation of a laminar flow of electrons with a uniform distribution of current density, and also create opportunities for extraordinary demagnification. The electrostatic field formation continues from the focusing electrode system to the anode electrode system. Most, and possibly all, of the electrode systems used in the embodiments of the invention, are preferably designed to be symmetrical about the longitudinal axis.

The electrostatic section is considered the first part or interior portion of the EOS which is electrically insulated from the second part or interior portion, as represented by a partition line in FIG. 1. The second part or interior portion is an electric field-free space with an optional, adjustable screen system 16 that moves horizontally (in the direction of the associated arrows 14 in FIG. 1) for measuring different sections of the electron beam 15. Thus, by moving the screen system 16 closer to or farther from the partition line, the screen system 16 can measure a different axial section of the electron beam 15. The partition line is provided by structure that defines a boundary of the electrostatic section, together with a body 11, in which the electric field is formed and includes an opening in the structure through which the electron beam exits the electrostatic section.

The cathode electrode system shown in FIG. 1 includes a cathode 1 and a field-forming near-cathode electrode system comprising a flat part 2, a curvilinear part 3 having a radius of curvature and which is contiguous with flat part 2 and radially outward therefrom and a cylindrical part 4 that is contiguous with curvilinear part 3 and radially outward therefrom. Curvilinear part 3 can be conical, spherical, or elliptical as long as the geometric bodies remain proportional in accordance with the invention. The near-cathode electrode system, i.e., the combination of the elements 2, 3, 4, has the same potential as cathode 1 and is separated from the cathode 1 and its assembly by a cavity, which may also be considered a space that physically separates the near-cathode electrode system from the cathode 1 (better represented in FIG. 3A described below). However, possible embodiments of the invention exist where the near-cathode electrode system 2, 3, 4 and the cathode 1 are electrically connected together in a manner known to those skilled in the art.

The cavity prevents pollution of the near-cathode electrode system 2, 3, 4 by the cathode 1, which would occur if there were a direct physical connection, i.e., contact between the near-cathode electrode system 2, 3, 4 and the cathode 1 at their front surfaces. As to its exact location, the cathode 1 includes a front surface and a side surface and the flat part 2 of the near cathode electrode system 2, 3, 4 includes a front surface and a side surface, wherein the side surface of the flat part 2 is spaced apart from the side surface of the cathode 1 by the cavity, Cathode 1 requires a surface having a flat form and capable of emitting electrons with uniform current distribution and may be either metallic or a single crystal and can be arranged to be a thermionic or cold cathode system and welded to ring materials on the same flat surface. Cathode 1, ring materials, and the heating system together comprise the cathode assembly, as is used in some of the embodiments herein.

Figure 2A:
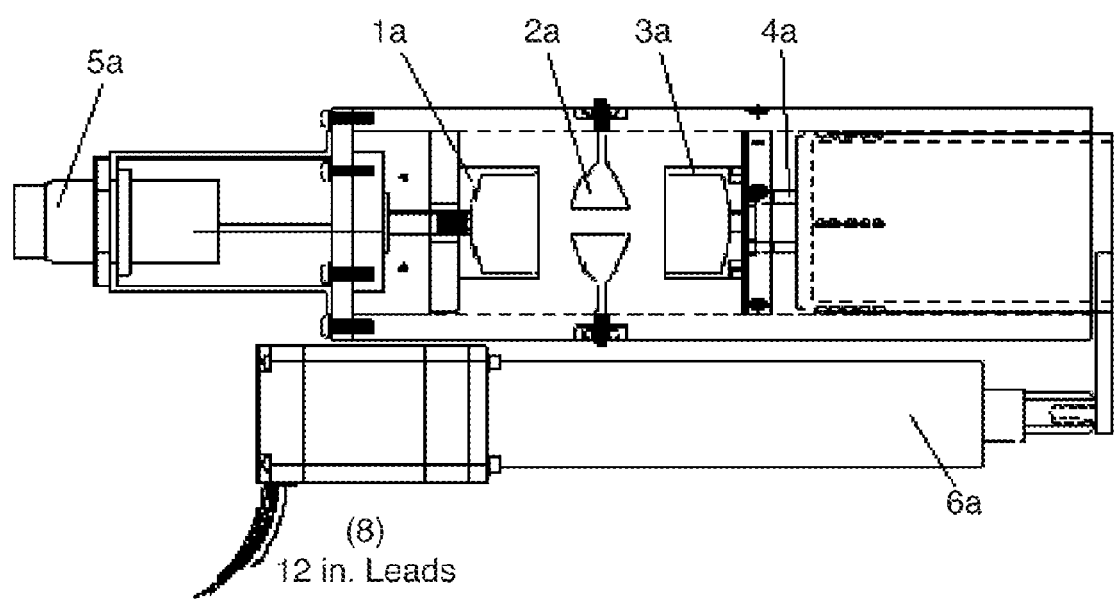
FIG. 2A illustrates an embodiment of the EOS in accordance with the invention that provides a laminar flow of electrons with a uniform distribution of current density.

FIG. 2A shows a preferred embodiment of the EOS where element 1a is the cathode assembly and near-cathode electrode system, element 2a is the focusing electrode system, element 3a is the anode electrode system, element 4a is the adjustable screen system, element 5a is the connector system, and element 6a is a movement mechanism that moves the adjustable screen system 4a. As shown in FIG. 2A, the system in accordance with the invention includes two clearly delineated parts or interior portions, wherein the first part or interior portion is or comprises the electrostatic section in which the cathode assembly and near-cathode electrode system 1a, the focusing electrode system 2a, and the anode electrode system 3a are present, while the second part or interior portion is electrically insulated from the first part and is or comprises an electric field-free space that includes the adjustable screen system 4a.

Figure 2B:
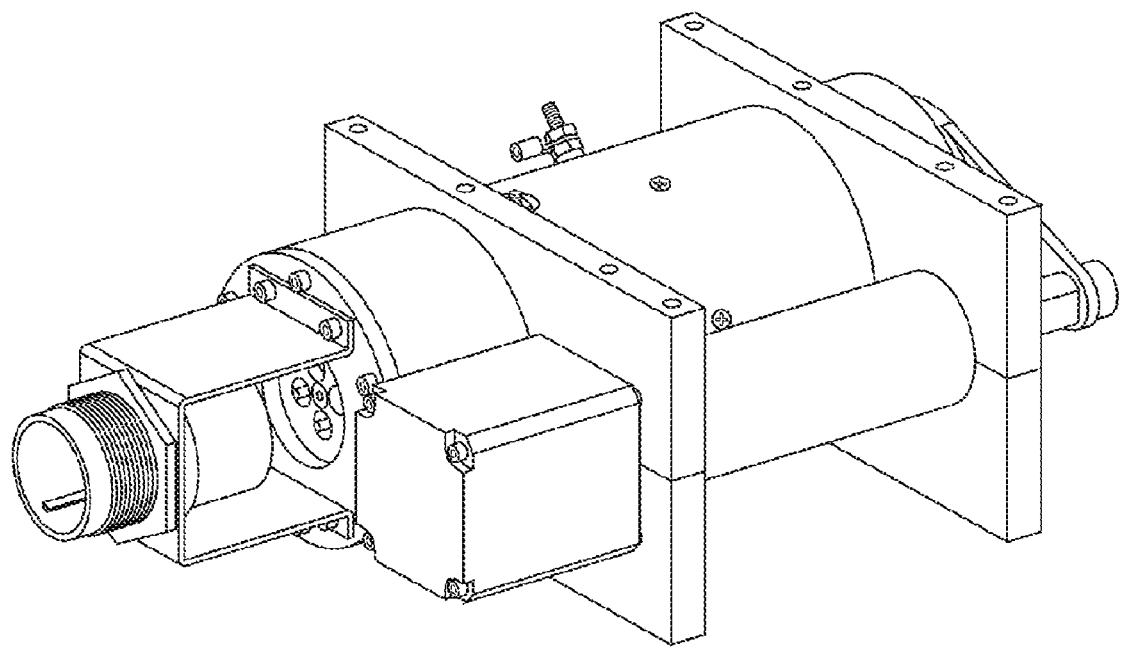
FIG. 2B is a three-dimensional view of an embodiment of the EOS in accordance with the invention that provides a laminar flow of electrons with a uniform distribution of current density.

FIG. 2B shows a three-dimensional view of a multiple functioning EOS device, such as that shown in FIG. 2A, where electron beams with uniform distribution of current density are generated. FIG. 2B more clearly shows that the first and second parts of the system may be mounted on the same structure and arranged in the same housing or casing.

Figure 3A:
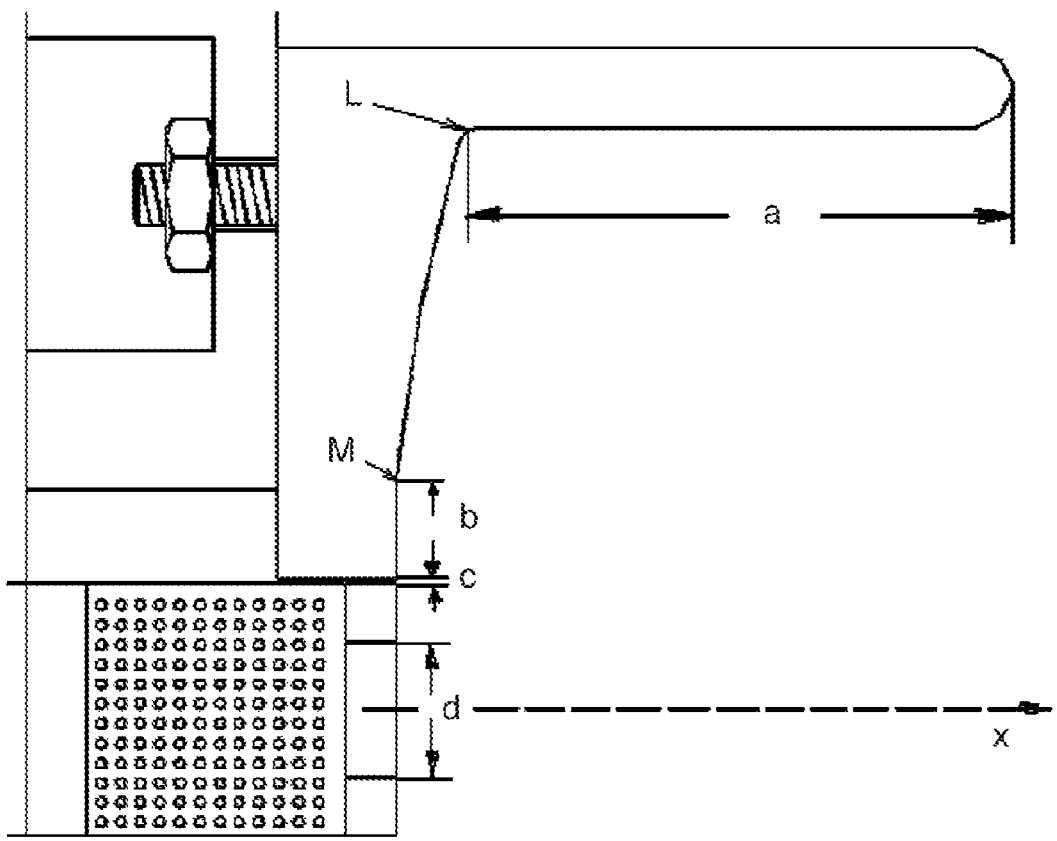
FIG. 3A illustrates a cathode assembly with near-cathode electrode system in accordance with the invention.

FIG. 3A shows the cathode assembly and the near-cathode electrode system wherein "d" is the diameter of the cathode 1 in FIG. 1, "c" is the thickness of the cavity between the near-cathode electrode system 2, 3, 4 and the cathode 1 in FIG. 1, "b" is the thickness of the flat part 2 in FIG. 1, "ML" is the dimension of the curvilinear part 3 in FIG. 1, and "a" is the height of the cylindrical part 4 in FIG. 1.

Figure 3B:
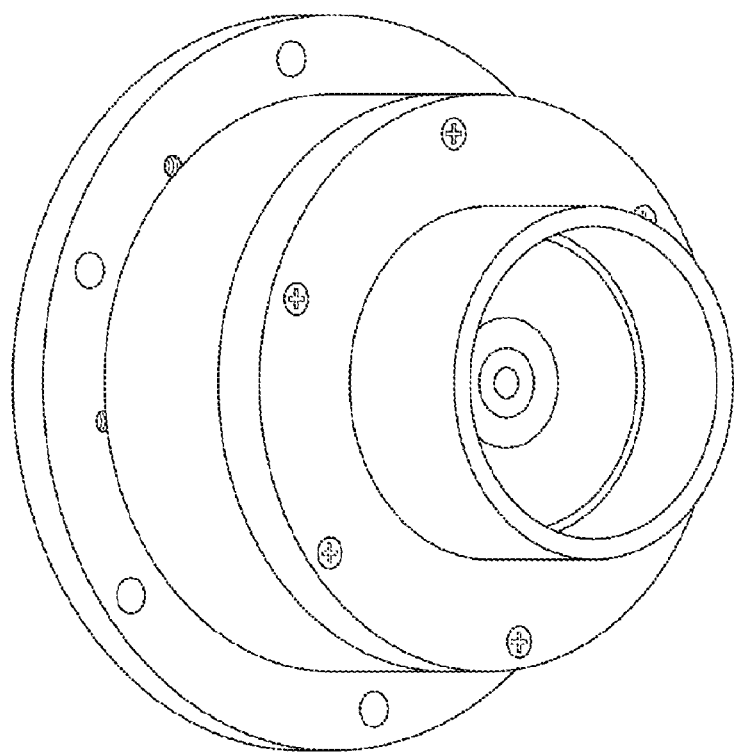
FIG. 3B is a three-dimensional view of an embodiment of a cathode assembly with near-cathode electrode system in accordance with the invention.
Figure 3C:
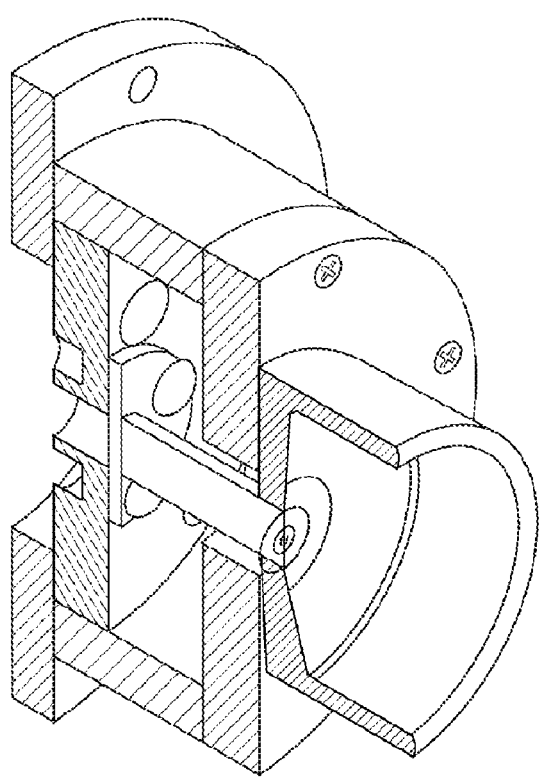
FIG. 3C is a three-dimensional view of a cross-section of FIG. 3B in accordance with the invention.

FIGS. 3B and 3C show three-dimensional views of the cathode assembly and near-cathode electrode system 2, 3, 4 together. Regardless of the composition and size of cathode 1 and whether it is heated or not, cathode 1 is constructed to enable it to maintain conditions for uniform or substantially uniform electron emission.

Cathode 1 and the near-cathode electrode system 2, 3, 4 are under a negative voltage ranging from about 0.25 kV to about 800 kV. This range is not limiting and other minimum and/or maximum negative voltages may be applied, and moreover, other ranges of negative voltages may be applied in the invention.

Figure 4:
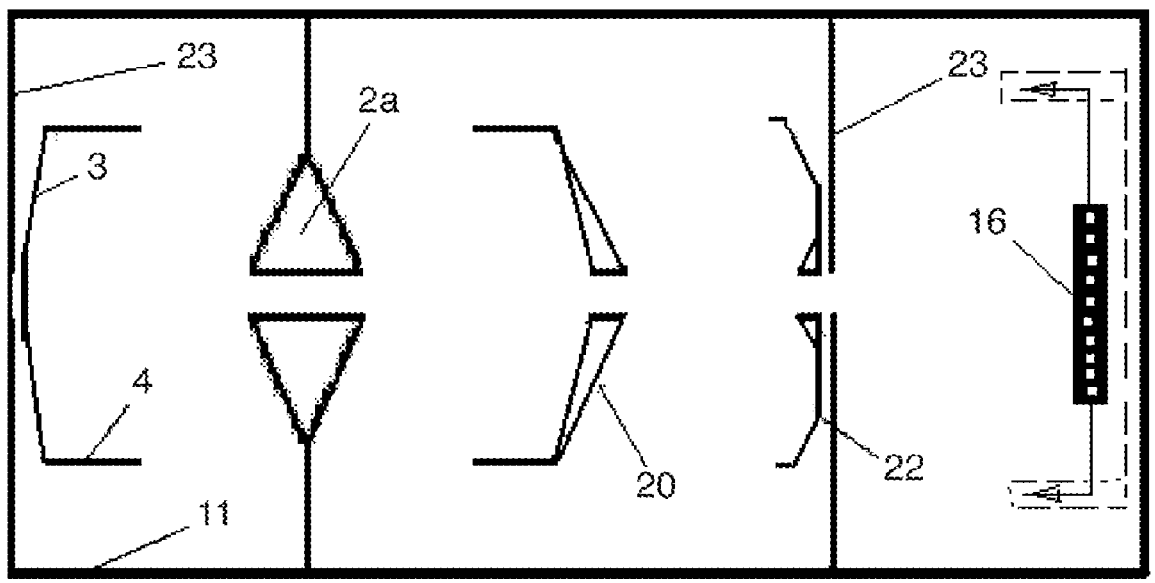
FIG. 4 is a sketch of an embodiment of an electro-static focusing area as in FIG. 1 edited to include a second anode with the back side of the first anode electrode system possibly having a different geometric form.

FIG. 4 shows an additional variation of the invention, which includes a second anode electrode system 22 in the electrostatic space defined by a housing or body, an insulator 23 between the electrostatic space and the electric field-free space that is also defined by the housing or body. Thus, the housing or body defines two separated spaces with an opening therebetween through which the electron beam passes from the electrostatic space to the electric field-free space (this passage of the electron beam being clearly shown in FIGS. 5A and 5B). The back side of the first anode electrode system 20 which may have a different geometric form and space positions, which together with the second anode form and space positions, will be determined in the optimization process in the CPO (Charged Particle Optics) simulation software. CPO can be used to assist in the optimization of the voltage and any other dependent parameters in the system.

FIG. 4 also shows that the first anode 20 may be constructed such that the inner and outer sides of the first anode 20 are spaced apart from one another over at least a portion thereof to provide the first anode 20 with a variable width and thereby create the different geometric forms (and this configuration may be used in any of the other embodiments disclosed herein). Similarly, the second anode 22 may be constructed such that the inner and outer sides of the second anode 22 are spaced apart from one another over at least a portion thereof to provide the second anode 22 with a variable thickness or width and thereby create the different geometric forms. The variability of the width of the anode 20 and/or 22 enables variable focusing of the electron beam thereby enabling optimization thereof.

An additional anode such as second anode 22 shown in FIG. 4, may be used in any of the embodiments disclosed herein. Moreover, any of the systems described above may include two or more additional anodes, arranged in the direction of the focused electron beam, e.g., a third anode spaced apart from the second anode 22 and having a uniform or variable thickness or width.

Figure 5A:
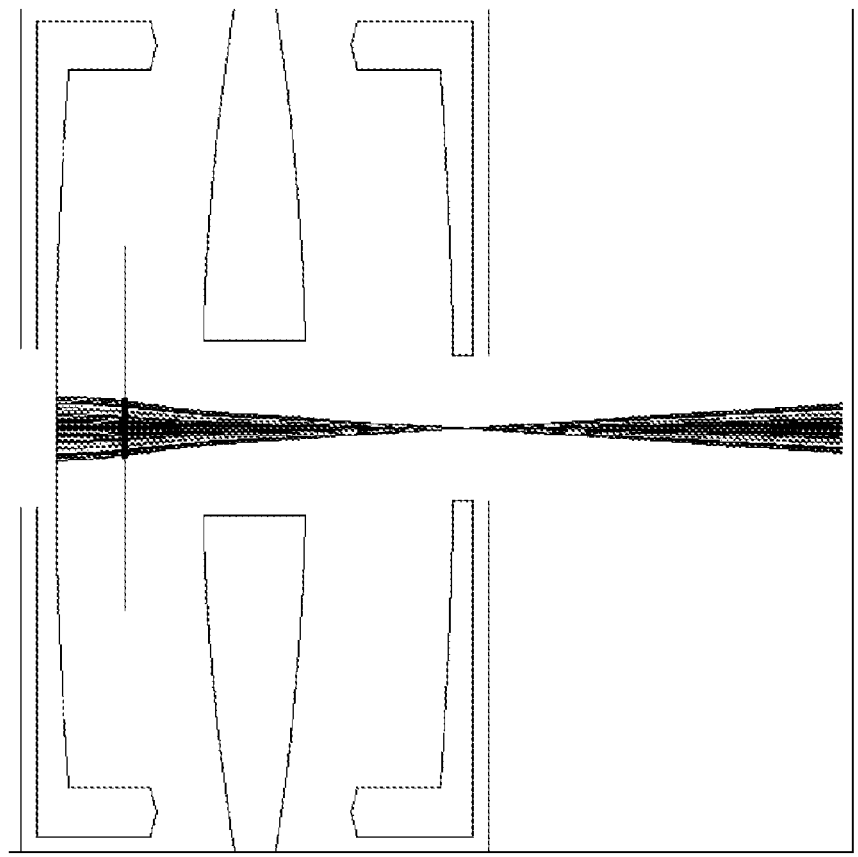
FIG. 5A shows electron trajectories in an embodiment of a system with a laminar electron flow with uniform distribution of current density without the space charge calculation method.
Figure 5B:
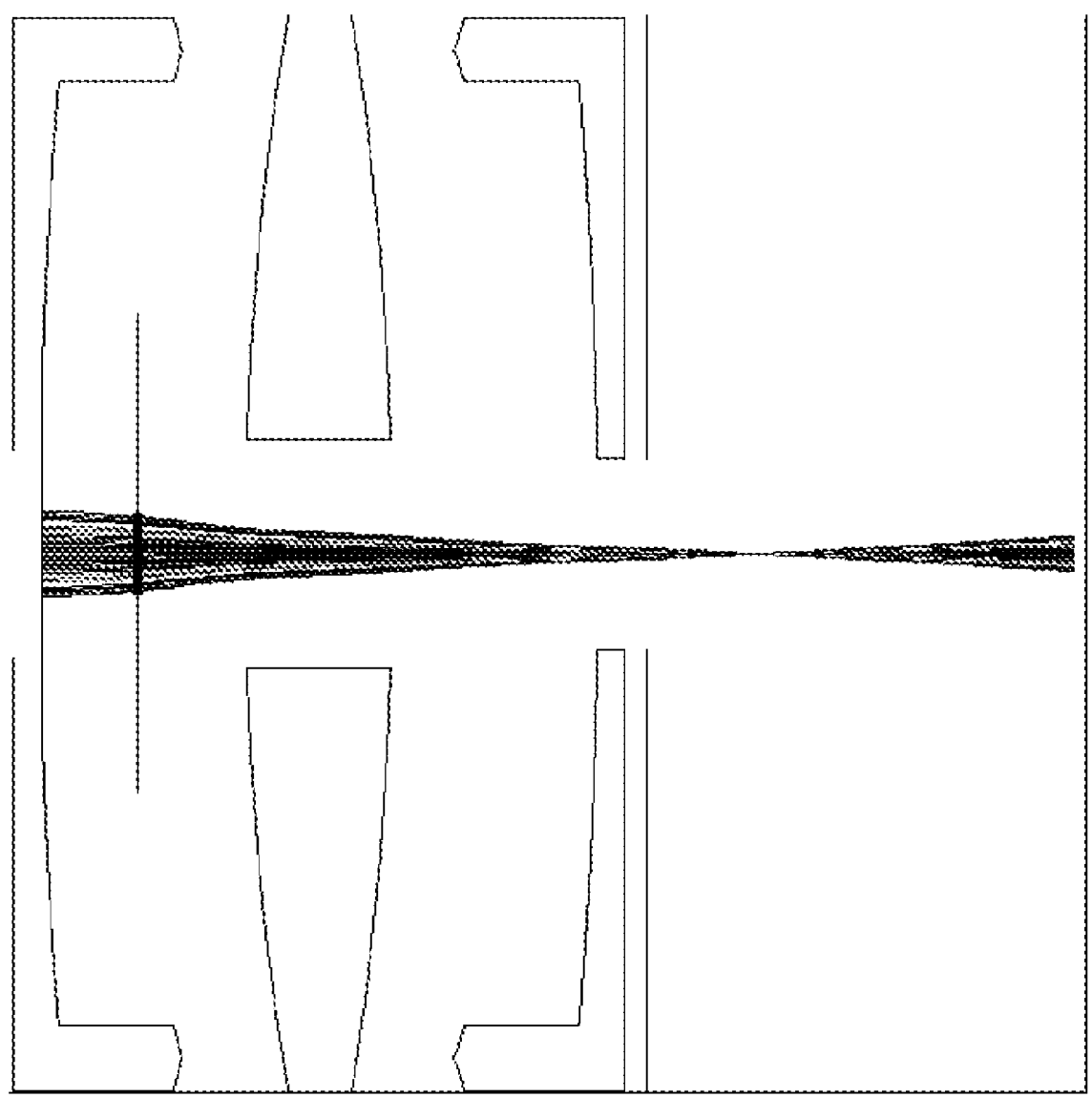
FIG. 5B shows electron trajectories in an embodiment of a system with a laminar electron flow with uniform distribution of current density with the space charge calculation method.

FIGS. 5A and 5B show a trajectory of electrons from the cathode in general to the adjustable screen system 16 in the electric field-free area of an EOS showing a uniform distribution of current density which has a crossover.

Figure 6:
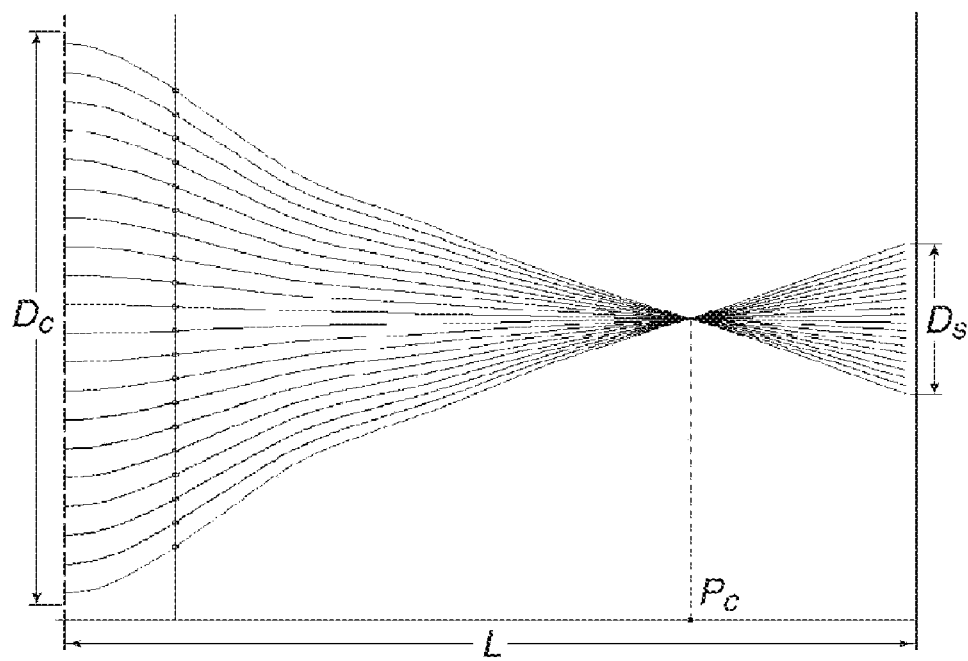
FIG. 6 shows a trajectory of electrons, which is characteristic of an electron beam in EOS, and shows optical parameters with a uniform distribution of current density with approximately 30× zoom.

FIG. 6 shows the diameter of the cathode (Dc), the diameter of the focal spot on the screen (Ds), the crossover point (Pc), and the length (L) from the cathode to the screen. These descriptions also apply to FIGS. 5A and 5B.

Flat part 2 from FIG. 1 of the near-cathode electrode system lies on the same level or behind the flat surface of cathode 1, and then, in a direction away from the center of cathode 1, leads into curvilinear part 3. Also, the radius of cathode 1 and the radius of the flat part 2 may be selected to optimize the invention through routine experimentation.

Optimization of the dimensions of cylindrical part 4 simplifies the possibility of regulation of the crossover point position on the horizontal axis. Consequently, a desired reduction in focal spot size is achieved. Also, the optimization process of the electric field in the electro-static area is possible, if necessary, through optimization of electrode shapes sizes and space parameters. Also, the position of cylindrical part 4 can be adjusted using a servo control method, if necessary. Any modifications or adjustments made to cylindrical part 4 must also be made to cylindrical part 10 to maintain symmetry throughout the design.

The EOS also includes a focusing electrode system, which may have different forms. The curvilinear parts can be conical, spherical, or elliptical as long as the geometric bodies remain proportional in accordance with the invention shown.

Referring back to FIG. 1, generally, each focusing electrode system has a particular form from a flat part 7 proximate the center or longitudinal axis, in a direction away from the axis, connects to curvilinear parts 5 and 6 which then connect to a horizontal part 12 and includes a central opening located along the horizontal axis shown in FIG. 1. The opening encompasses the horizontal axis of the system and preferably has a center aligning therewith. Thus, the focusing electrode system has an opening through which the electron beam generated by the cathode electrode system passes in a path toward the opening in the anode electrode system. Horizontal part 12 may be considered an inside electrode that is arranged in the interior space defined between the flat parts and curvilinear parts 5, 6. The inside electrode may extend from the lower and upper edges of the flat parts 5 across the space there between, i.e., from boundaries of the openings in the focusing electrodes defined by the curvilinear parts 5, 6.

Optimization of the field in the electro-static focusing area is possible by adjusting the length of flat part 7; however it is also necessary to adjust sections 5 and 6 so that parts 5, 6, 7 and 12 remain connected together. Curvilinear parts 5 and 6 are, in a preferred embodiment, required to be identical and symmetrical about flat part 7. The connection of the focusing electrode system (5, 6, 7, and 12) to a body 11, which is also shown in FIG. 1, enables the focusing electrode system to be grounded, represented by 13. Focusing electrode systems may also have different voltages other than ground if not connected to the body 11. In general, the focusing electrodes are preferably symmetrical about the connecting flat parts 7.

The EOS also includes an anode electrode system arranged on an opposite side of the focusing electrode system facing near-cathode electrode system and is comprised of a flat part 8, a curvilinear part 9, a cylindrical part 10 contiguous with curvilinear part 9, and an opening defined by the distance between the horizontal axis and the beginning of flat part 8. Thus, the anode electrode system has an opening through which the electron beam generated by the cathode electrode system passes. The curvilinear part 9 can have a conical, spherical, or elliptical form together with curvilinear part 3 as a mirror image, and as a result the near-cathode electrode system and anode electrode system are symmetrically identical about the longitudinal axis. This symmetry and proportionality of dimensions in the cylindrical parts 3 and 9 create opportunities for different developments for design of the EOS. These three shapes can be used in every version as long as the geometric bodies remain proportional in accordance with the invention. For example, if cylindrical part 3 is spherical, automatically cylindrical part 9 is spherical.

Cylindrical part 10 may have a form identical to cylindrical part 4 of the near-cathode electrode system and the length of cylindrical part 10 and cylindrical part 4 are equal. All electrodes of the anode electrode system are electrically connected together in a manner known to those skilled in the art. The anode electrode system is under a positive voltage ranging from about 0.25 kV to about 800 kV. This range is not limiting and other minimum and/or maximum positive voltages may be applied, and moreover, other ranges of positive voltages may be applied in the invention. Further, the positive voltage applied to the anode may have the same magnitude as the negative voltage applied to the cathode.

The field forming near-cathode electrode system and focusing electrode system are located along the horizontal axis and are housed inside the body 11 shown in FIG. 1. The general function of the body 11 is to limit the space for the electric field. Dimensions of the body 11 are calculated from the dimensions of the cathode electrode system, the focusing electrode system, the anode electrode system, and the adjustable screen system. All the systems are constructed of materials to enable use of the EOS in accordance with the invention.

A uniform or substantially uniform distribution of current density can also be achieved using different variations of the preferred embodiment shown in FIG. 1. Different variations and modifications are possible and envisioned to be within the scope and spirit of the invention as long as the parameter relations between electrodes remain in accordance with the concept of the invention, described below. Also, modifications are possible to accommodate different applications while maintaining a uniform distribution of current density. These modifications include:

- One possible variation of an embodiment in accordance with the invention contains only a single curvilinear part 5 which projects toward cathode electrode system with curvilinear part 6 absent. As such, the convex side of curvilinear part 5 faces cathode electrode system while the concave side faces the anode electrode system.
- Another possible variation of an embodiment in accordance with the invention contains an asymmetry between the cathode electrode system and the anode electrode system. For example, the curvilinear part 9 and the cylindrical part 10 are not provided in the anode electrode system.
- Another possible variation of an embodiment in accordance with the invention omits electrodes 6, 9 and 10, i.e., curvilinear parts 6, 9 and 10.
- Another possible variation of an embodiment in accordance with the invention does not include the annular opening section in the anode electrode system. For example, X-ray technology would use a material such as tungsten for the entire part 8.
- Another possible variation of an embodiment in accordance with the invention allows for synchronous adjustment of cylindrical parts 4 and 10.

The adjustable screen system 16 includes additional opportunities for direct measurement of e-beam parameters, for example, a CCD camera replaces the screen in the adjustable screen system 16 and then performs as an adjustable measurement system. The adjustment of the screen system 16 can be performed, for example, via servo control through a PC or manually.

An important constructional feature of the EOS in accordance with the invention is based on the conceptual method CGMR (Cone and Golden Mean Ratio) for defining and calculating all space coordinates and characteristics of the EOS for drawing of the design. The essence of the conceptual method is the creation of a plurality of virtual cones, for example, a preferred configuration wherein six virtual cones are provided.

They are defined as follows: the position of the cone apex and the use of the golden mean ratio proportional values are used to define the radius of curvilinear part 3 and the radius of curvilinear part 5, the same method is used to find the radii values for cylindrical parts 6 and 9 shown in FIG. 1. When the cone apex is located at the intersection of the horizontal axis and a center of the curvilinear part 9 (as depicted in FIG. 1), the parameters of the design drawing are defined for the near-cathode electrode system. The center of the curvilinear part 9 may be a virtual center when an opening is formed therein or an actual point on the curvilinear part 9. It is important to note that the horizontal axis is defined when the system is in a horizontal configuration. However, when the system is in other than a horizontal configuration, the "horizontal axis" for the purpose of this explanation would be considered the longitudinal axis of the system. In this case, a boundary of a transition area from the flat part 2 to the curvilinear part 3 of the field-forming cathode electrode system is situated on a surface of a first virtual cone that has an apex on a longitudinal axis on the system at a location at a center of the anode electrode system, i.e., the curvilinear part 9.

Similarly, when the cone apex is located at the origin of the coordinate system of FIG. 1, the parameters of the design drawing are defined for the anode electrode system while maintaining symmetry of the system design about flat part 7 from the focusing electrode system. In this case, a boundary of a transition area from the flat part 8 to the curvilinear part 9 of the anode electrode system is situated on a surface of a second virtual cone that has an apex on the longitudinal axis on the system at a location at a center of the field-forming cathode electrode system.

Furthermore, the parameters of the focusing electrode system are defined by this conceptual method in accordance with the invention, from the creation of a smaller virtual cone which is located inside the previously mentioned larger virtual cone. The focusing electrodes 5 and 6 are symmetrical and are a mirror image of one another about flat part 7 and also focusing electrode 5 is contiguous with flat part 12 and flat part 12 is contiguous with focusing electrode 6. Using the conceptual method CGMR, the opening part of the focusing electrode system which is an important constructional feature of some embodiments of the EOS is defined by the point where focusing electrode 5 is contiguous with flat part 12 and the boundary of a transition area from the flat part 2 to the curvilinear part 3 of the near-cathode electrode system. These points are situated on the surface of a virtual cone that has an apex on the horizontal axis. In this case, the boundary of the transition area from the flat part 2 to the curvilinear part 3 of the field-forming cathode electrode system is situated on a surface of virtual cones that have an apex on a longitudinal axis on the system at a location at a center of each of the focusing electrodes 5, 6. Similarly, the boundary of the transition area from the flat part 8 to the curvilinear part 9 of the anode electrode system is situated on a surface of virtual cones that have an apex on the longitudinal axis on the system at a location at a center of each of the focusing electrodes 5, 6.

To achieve this design, the dimensions of flat part 2 and the curvilinear part 3 of the near-cathode electrode system are first determined and then the dimensions of the opening and curvilinear part 5 of the focusing electrode system is determined, or vice versa, or a table is created which contains the appropriate possible sizes and shapes of the flat part 2, curvilinear part 3, curvilinear part 5 and opening therein, which will enable the above identified condition to be satisfied. The dimensions of the flat part 8 and curvilinear part 9 are considered when designing the parts in order to create the virtual cones described above.

The optimal voltage ranges for applied voltages to cathode electrode system, focusing electrode system, first anode electrode system, and second anode electrode system are not limited and other voltage ranges may be used. For example, other voltage ranges can be from about 0 V to 30 KV or from 30 KV to 950 KV for practical applications. The system may also include grid electrodes alongside the outer surfaces of the curvilinear parts 5 and 6 and the flat part 7. However, the grid electrodes are only required for low voltage applications and the embodiment shown in FIG. 1 does not include them.

FIG. 5A may be calculated using CPO simulation software with out-space charge effect and FIG. 5B is with a space charge effect. It can be seen from the plots that when all conditions remain the same and only the space charge calculation is turned on, the result is a shift in the crossover point and is consistent with a self-biasing effect, which has been proven through experimentation by Los Alamos National Laboratory in Los Alamos, N. Mex. in the paper titled "Electron Beam Spot Size Stabilization for Radiographic Application". These results were also confirmed using the advanced simulation program CPO. The CPO program has a wide range of system analysis opportunities such as equipotential contours, electric contours and electric vectors, space charge contours, and space charge color fields in an EOS. It is seen that the invention allows a construction of a large variety of devices with different focal radii.

The essence of the CGMR conceptual method creates multiple opportunities for design of the first section in the EOS in accordance with the invention. This conceptual method is based on the creation of six virtual cones and the use of the golden mean ratio. Three virtual cones have a common apex located at the point where curvilinear part 9 would intersect the horizontal. These three virtual cones are used in concept for the creation of the near-cathode electrode system and the convex focusing electrode facing the cathode electrode system. The other three virtual cone systems have a common apex located at the point where curvilinear part 3 would intersect the horizontal axis at the origin. These three virtual cones are used in concept for the creation of the anode electrode system and the convex focusing electrode facing the anode electrode system. The value of radius R3 of curvilinear part 3, shown in FIG. 1, is used to create a first virtual cone and the value of radius R5 of curvilinear part 5 is used to create a second smaller virtual cone located inside the first virtual cone. The ratio of radius R5 to radius R3 ranges from about 0.61 to about 0.622 (again though, this range is not limiting). The Golden Mean Ratio is around 0.6181 and therefore is located in the center of this range. To maintain symmetry, substantially the same ratio for the radius R6 of curvilinear part 6 to the radius R9 of curvilinear part 9 is used.

Furthermore, a line drawn defined by the first virtual cone which intersects the flat part 7 along the longitudinal axis and continues to the point where curvilinear part 3 is contiguous with cylindrical part 4 defines the first virtual cone and this point is also found using the Golden Mean Ratio.

A third virtual cone is defined by the point where curvilinear part 3 is contiguous with flat part 2 and the point where curvilinear part 5 is contiguous with flat part 12. The other three virtual cone systems which have a common apex located at the origin symmetrically define the anode electrode system parameters.

This invention has applications in all conventional EOS systems because a radical new result in quality is achieved for any device in the EOS in accordance with the invention. Any device including an EOS in accordance with the invention improves the resulting visual characteristics of the device, for example, improved clarity of a picture in display devices as well as a significant increase in the light intensity (e.g., 2500 times for 50 times compression). The service life of electro-vacuum devices is thereby increased, while time resolution and device dimensions can be reduced. For example, conventional E-beam lithography systems produce a current of around 0.25 nA. In comparison, the invention achieves a minimum current of about 0.7 mA and can perform the same lithography in minutes that conventional systems take around 20 hours for 1 square centimeter.

The system in accordance with the invention mandates a particular relative arrangement and dimensioning scheme, e.g., geometrical sizes of the cathode electrode system and focusing electrode system, to enable generation of an electrostatic focusing area. Satisfaction of the condition relating to the virtual cones eliminates and avoids problems with the uniform distribution of current density, and also enables an important optical reduction, up to about 50 times, and maintaining a high definition and uniform ability in every pixel. The novel uniform focusing system should therefore be highly successful in expensive EOS systems, such as the previously mentioned e-beam lithography systems.

Figure 7A:
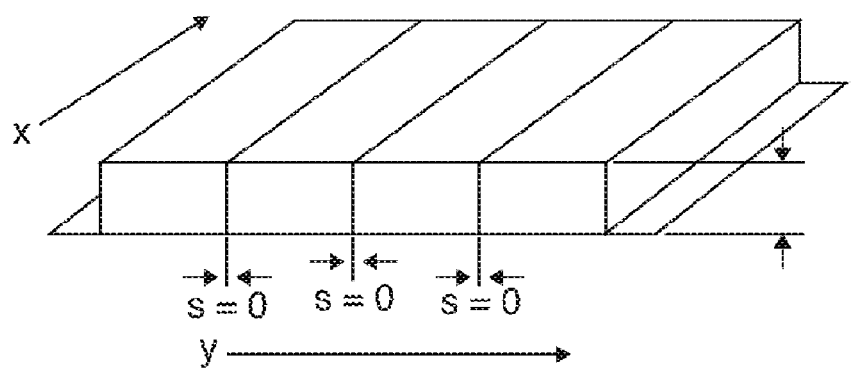
FIG. 7A shows a raster line related to the trajectories shown in FIGS. 5A, 5B and 7 whose shape is rectangular, resulting in uniform distribution of current density in the device shown in FIG. 2.
Figure 7B:
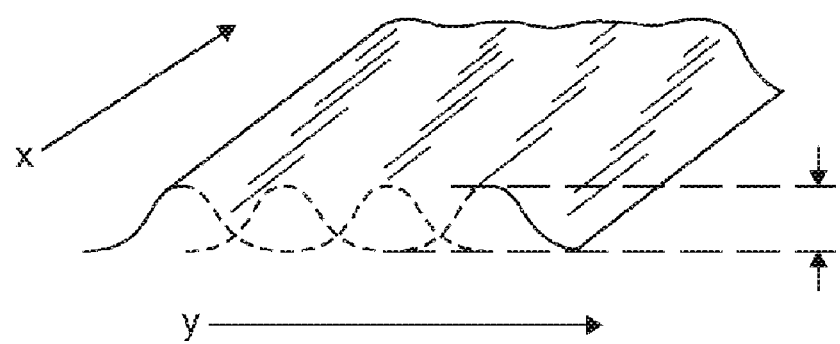
FIG. 7B shows a residual raster line modulation wherein adjacent lines overlap, and the profile is a Gaussian distribution of current density which is commonly seen in conventional EOS devices.

Multiple opportunities in the metrology field exist for using the invention as a standard for testing any CRT systems. For example, the invention, which has a uniform distribution as seen in FIG. 7A, can be used to calibrate conventional CRT systems with Gaussian distributions shown in FIG. 7B. Adjustment of the focal spot creates new opportunities in the area of metrology as the beam can be used as a standard for calibrating any e-beam devices through the comparisis method.

The adjustable screen provides opportunities for different applications requiring different focal spot sizes using a single electron gun because it allows for different sections of the gun to be used where each section has a different demagnification number. For example, if 50 times demagnification is required in the e-beam lithography area, the adjustable screen needs to be moved closer to the crossover point. The adjustable screen is also used for exactly defining the demagnification number which is required in different photonic systems for optimization of pixel sizes which results in an ideal image with zero phase noise.

There are several variations of the above system that are envisioned by the inventors and intended to be encompassed by the claims. These variations includes an embodiment of a focusing system wherein there is only a single curvilinear part 5 which projects toward the cathode 1 so that the convex side of the curvilinear part 5 faces the cathode 1 while the concave side faces the anode electrode system. In another variation, the anode electrode system only includes the flat part 8, i.e., the curvilinear part 9 and the cylindrical part 10, are not provided. Moreover, any of the systems described above may include two or more additional anodes, arranged in the direction of the focused electron beam, e.g., a third anode spaced apart from the second anode and having either a uniform thickness or variable thickness.

In conclusion, it has been demonstrated in this art that not only achieved a uniform distribution of current density is achieved with the structure described above, but also there are multiple device opportunities in a single electro vacuum system.

While particular embodiments of the invention have been shown and described, it will be obvious to those skilled in the art that changes and modifications may be made without departing from the invention in its broader aspects, and, therefore, the aim in the appended claims is to cover all such changes and modifications as fall within the true spirit and scope of the invention. Indeed, it is envisioned that any feature shown in or described in connection with one embodiment may be applied to any of the other embodiments shown or described herein to the extent not inconsistent with a particular feature of that embodiment.

The invention claimed is:

1. An apparatus for focusing electron beams, said apparatus comprising:
   a housing comprising a first interior portion and a second interior portion;
   an electrode system disposed in said first interior portion, said electrode system comprising a cathode assembly and at least one anode assembly; and
   an insulator arranged between said first interior portion and said second interior portion,
   said at least one anode assembly being arranged between said cathode assembly and said insulator,
   said cathode assembly generating an electron beam that passes through an opening in each of said at least one anode assembly and then through an opening in said insulator into said second interior portion of said housing,
   said electrode system further comprising a near cathode assembly arranged alongside said cathode assembly, said cathode assembly comprising a front surface and a side surface and said near cathode assembly comprising a front surface and a side surface, said side surface of said near cathode assembly being spaced apart from said side surface of said cathode assembly by a cavity, said cathode assembly and said near cathode assembly having substantially the same electrical potential,
   said cathode assembly further comprising a cathode having a front surface with a flat form and said near-cathode assembly comprises a flat part that is at the same level as said flat front surface of said cathode, a curvilinear part contiguous with said flat part and situated radially outward from said flat part, and a cylindrical part contiguous with said curvilinear part and situated radially outward from said curvilinear part, said near-cathode assembly being spaced apart from said cathode assembly by the cavity.

2. The apparatus of claim 1, wherein said insulator is separated from said at least one anode assembly.

3. The apparatus of claim 1, further comprising a focusing electrode system arranged in said first interior portion and spaced apart from and situated between said cathode assembly and said at least one anode assembly, said focusing electrode system including a focusing electrode having an opening through which the electron beam generated by said cathode assembly passes.

4. The apparatus of claim 1, wherein said at least one said anode assembly comprises an anode electrode having a variable width that enables variable focusing of the electron beam thereby enabling optimization thereof, the width of said anode electrode varying such that one portion of said anode electrode along a radial line from a longitudinal axis extending through the opening in said anode electrode has a different width than another portion of said anode electrode along the same radial line.

5. The apparatus of claim 1, wherein said at least one said anode assembly comprises an anode electrode, inner and outer sides of said anode electrode being spaced apart from one another over at least a portion thereof to provide said anode electrode with a variable width, the width of said anode electrode increasing in a direction toward a longitudinal axis extending through the opening in said anode electrode.

6. The apparatus of claim 1, wherein said at least one anode assembly comprises a plurality of anode assemblies, each of said anode assemblies including at least one anode electrode.

7. The apparatus of claim 1, wherein said second interior space is a space free of electric fields caused by any electrodes under potential.

8. An apparatus for focusing electron beams, said apparatus comprising:
   a housing;
   an electrode system disposed within said housing, said electrode system comprising a cathode assembly and a near cathode assembly arranged alongside said cathode assembly, said cathode assembly comprising a cathode having a front surface with a flat form and a side surface and said near cathode assembly comprising a front surface and a side surface, said side surface of said near cathode assembly being spaced apart from said side surface of said cathode by a cavity, said near-cathode assembly further comprising a flat part defining said front surface that is at the same level as said flat front surface of said cathode,
   said cathode assembly and said near cathode assembly having substantially the same electrical potential.

9. An apparatus for focusing electron beams, said apparatus comprising:
   a housing;
   an electrode system disposed within said housing, said electrode system comprising an anode electrode and a cathode electrode, said cathode electrode generating an electron beam that passes through an opening in said anode electrode, said anode electrode including the opening through which electron beam passes and a first portion extending radially outward from the opening and a second substantially cylindrical portion extending axially outward from said first portion in a direction toward said cathode electrode, said second portion being radially outward of said first portion; and
   said electrode system further comprising a near-cathode electrode system connected to said cathode electrode and comprising a first portion adjacent to said cathode electrode and a second substantially cylindrical portion extending axially outward from said first portion in a direction toward said anode electrode, said second portion being radially outward of said first portion,
   at least one of second cylindrical portion of said anode electrode, and thus said anode electrode, and said second cylindrical portion of said near-cathode electrode system, and thus said near-cathode electrode system and said cathode electrode connected thereto, being adjustable so as to vary a distance between said cathode electrode and said anode electrode.

10. The apparatus of claim 9, wherein said first portion of said anode electrode system comprises a flat part and a curvilinear part which is contiguous with said flat part, said second substantially cylindrical portion being contiguous with said curvilinear part, and said near-cathode electrode system comprises a flat part and a curvilinear part which is contiguous with said flat part, said second substantially cylindrical portion of said near-cathode electrode system being contiguous with said curvilinear part of said near-cathode electrode system, said curvilinear part of said anode electrode being a mirror image of said curvilinear part of said near-cathode electrode system.

11. The apparatus of claim 9, further comprising a focusing electrode system disposed between said cathode electrode and said anode electrode.

12. The apparatus of claim 11, wherein said focusing electrode system comprises a curvilinear section.

13. The apparatus of claim 11, wherein said focusing electrode system comprises a focusing electrode including an opening through which the electron beam generated by said cathode electrode.

14. The apparatus of claim 9, wherein both of said second cylindrical portion of said anode electrode, and thus said anode electrode, and said second cylindrical portion of said near-cathode electrode system, and thus said near-cathode electrode system and said cathode electrode connected thereto, are adjustable to enable symmetry to the apparatus with different positions of said anode electrode and said cathode electrode.

15. The apparatus of claim 9, wherein said anode electrode comprises a flat part, and a curvilinear part which is contiguous with said flat part and situated radially outward from said flat part, said second substantially cylindrical portion of said anode electrode being contiguous with said curvilinear part and being situated radially outward from said curvilinear part.

16. The apparatus of claim 9, wherein said first portion of said anode electrode system comprises a flat part and a curvilinear part which is contiguous with said flat part, said second substantially cylindrical portion of said anode electrode surrounding said flat part and said curvilinear part.

17. The apparatus of claim 9, wherein dimensions of said second substantially cylindrical portion of said anode electrode and said second substantially cylindrical portion of said near-cathode electrode system are selected to effect regulation of a position of a crossover point of the electron beam on a longitudinal axis.

\* \* \* \* \*